(12) United States Patent
Behera et al.

(10) Patent No.: US 7,940,550 B2
(45) Date of Patent: May 10, 2011

(54) SYSTEMS AND METHODS FOR REDUCING MEMORY ARRAY LEAKAGE IN HIGH CAPACITY MEMORIES BY SELECTIVE BIASING

(75) Inventors: Niranjan Behera, Newark, CA (US); Deepak Sabharwal, Fremont, CA (US); Yong Zhang, Fremont, CA (US)

(73) Assignee: Synopsys, Inc., Moutain View, CA (US)

( * ) Notice: Subject to any disclaimer, the term of this patent is extended or adjusted under 35 U.S.C. 154(b) by 54 days.

(21) Appl. No.: 12/558,816

(22) Filed: Sep. 14, 2009

(65) Prior Publication Data

US 2011/0063893 A1    Mar. 17, 2011

(51) Int. Cl.
*G11C 11/00* (2006.01)
(52) U.S. Cl. ............... 365/154; 365/189.09; 365/230.06
(58) Field of Classification Search .................. 365/154, 365/156, 189.09, 226, 227, 230.06, 230.15
See application file for complete search history.

(56) References Cited

U.S. PATENT DOCUMENTS

| | | | |
|---|---|---|---|
| 6,343,352 B1 * | 1/2002 | Davis et al. | 711/158 |
| 7,061,794 B1 | 6/2006 | Sabharwal et al. | |
| 7,668,035 B2 * | 2/2010 | Chu et al. | 365/227 |
| 7,692,964 B1 * | 4/2010 | Sabharwal et al. | 365/185.07 |
| 7,760,575 B2 * | 7/2010 | Tooher et al. | 365/226 |
| 2009/0168497 A1 | 7/2009 | Tooher et al. | |

* cited by examiner

*Primary Examiner* — Gene N Auduong
(74) *Attorney, Agent, or Firm* — Jones Day; Brett Lovejoy

(57) ABSTRACT

A source-biasing mechanism for leakage reduction in SRAM in which SRAM cells are arranged into a plurality of sectors. In standby mode, the SRAM cells in a sector in the plurality of sectors are deselected and a source-biasing potential is provided to the SRAM cells of the plurality sectors. In working mode, the source-biasing potential provided to the SRAM cells of a selected sector in the plurality of sectors is deactivated and the SRAM cells in a physical row within the selected sector are read while the remaining SRAM cells in the unselected sectors continue to be source-biased. The source-biasing potential provided to the SRAM cells that are in standby mode can be set to different voltages based on the logical state of control signals.

21 Claims, 7 Drawing Sheets

| | | |
|---|---|---|
| 114-8-1 | 106-8 | 114-8-2 |
| 108 | 110 | 108 |
| 114-7-1 | 106-7 | 114-7-2 |
| | | |
| 114-6-1 | 106-6 | 114-6-2 |
| 108 | 110 | 108 |
| 114-5-1 | 106-5 | 114-5-2 |
| | | |
| 114-4-1 | 106-4 | 114-4-2 |
| 108 | 110 | 108 |
| 114-3-1 | 106-3 | 114-3-2 |
| | | |
| 114-2-1 | 106-2 | 114-2-2 |
| 108 | 110 | 108 |
| 114-1-1 | 106-1 | 114-1-2 |
| | | |
| 102 | 104 | 102 |

FIG. 1

SYSTEMS AND METHODS FOR REDUCING MEMORY ARRAY LEAKAGE IN HIGH CAPACITY MEMORIES BY SELECTIVE BIASING

1 FIELD

The present disclosure relates generally to semiconductor memories. More particularly, and not by way of any limitation, the present disclosure is directed to a sector-based source-biasing scheme for reducing leakage in static random access memory (SRAM) cells.

2 BACKGROUND

Static random access memory or SRAM devices comprising a plurality of memory cells are typically configured as an array of rows and columns, with one or more I/Os (e.g., ×4, ×8, ×16, etc. configurations). Also, such memories may be provided in a multi-bank architecture for applications where high density, high speed and low power are required. Regardless of the architecture and type, each SRAM cell is operable to store a single bit of information. Access to this information is facilitated by activating all memory cells in a given physical row (by driving a wordline associated therewith) and outputting the data onto bitlines associated with a selected column for providing the stored data value to the selected output. Once the data is disposed on the bitlines, voltage levels on the bitlines begin to separate to opposite power supply rails (e.g., $V_{DD}$ and ground), and a sense amplifier is utilized to latch the logic levels sensed on the bitlines after they are separated by a predetermined voltage difference, typically ten percent or less of $V_{DD}$. Furthermore, the sense amplifier may be provided as a differential sense amplifier, with each of the memory cells driving both a data signal and a data-bar signal on the complementary bitlines (e.g., data lines) associated with each column. In operation, prior to activating the memory cells, the bitlines are precharged and equalized to a common value. Once a particular row and column are selected, the memory cell corresponding thereto is activated such that it pulls one of the data lines toward ground, with the other data line remaining at the precharged level, typically $V_{DD}$. The sense amplifier coupled to the two complementary bitlines senses the difference between the two bitlines once it exceeds a predetermined value and the sensed difference is indicated to the sense amplifier as the differing logic states of "0" and "1".

As the transistor device sizes continue to decrease, e.g., 0.13 microns or smaller, several issues begin to emerge with respect to the operation of SRAM cells, chiefly because at such dimensions the devices suffer from high values of leakage in the off state in standby mode. Essentially, these devices are no longer ideal switches; rather they are closer to sieves, having a non-negligible constant current flow path from drain to source or from drain/source to substrate even in the off state. The high leakage causes two major problems. First, because of the generation of large static current as leakage, there is increased static power consumption as a result. Second, which is more serious, is the issue of incorrect data reads from the SRAM cells. The accumulated leakage current from all the bitcells in a selected column is now comparable to the read current, thereby significantly eroding the bitline differential required for reliable sensing operations.

A technique for reducing standby leakage currents in a SRAM cell is disclosed in "16.7 fA/cell Tunnel-Leakage-Suppressed 16 Mb SRAM for Handling Cosmic-Ray-Induced Multi-Errors" by Kenichi Osada, Yoshikazu Saitoh, Eishi Ibe and Koichiro Ishibashi (in IEEE International Solid-State Circuits Conference, 2003, pages 302 303), where the source terminals of a plurality of SRAM cells on a single bitline column are coupled together for providing a biasing potential. Whereas such a scheme is seen to reduce total standby current, it does not improve the ratio of read current ($I_R$) to cell leakage current ($I_L$), however.

A technique for reducing standby leakage currents in SRAM cells is also disclosed in U.S. Pat. No. 7,061,794 B1. As disclosed therein, when memory cells of a given sector are in standby mode, the write-lines to each physical row of memory cells in the sector are in a deselected state whereas the sector source lines are driven to a select potential in order to reduce memory leakage. When a memory read is activated for a given physical row in the sector, the write line associated with the desired physical row is driven high. This causes the logic associated with the desired physical row to drive the source line for the physical row low. The source lines for other physical rows in the sector are maintained at the selected (biased) potential. The voltage differentials of each of the cells in the selected physical row are sensed and the memory cells are restored to standby mode upon the commencement of another read operation for another physical row.

While the memory architectures disclosed in U.S. Pat. No. 7,061,794 B1 are very useful in their own right, they suffer some drawbacks. The disclosed memory architectures require logic for biasing each physical row in the SRAM. In particular, the decoding logic and the biasing circuit are part of the X-decoder (X-address decoder). This extra logic presents an overhead for each of the physical rows in the memory thereby causing significant overall area overhead. In other words, this extra logic takes up space on the chip that could otherwise be used for other functions, such as placement of additional memory cells. Moreover, the biasing logic in the memory architectures disclosed in U.S. Pat. No. 7,061,794 B1 are in the access path, resulting in significant speed loss. Additionally, the bias voltage used to bias cells in the memory architectures disclosed in U.S. Pat. No. 7,061,794 B1 cannot be adjusted. This represents another drawback because it has been determined that slight variances in the doping of silicon, and/or other features of silicon that affect the optimum value for preventing voltage leakage. In other words, different silicon environments dictate different bias voltages in order to minimize the amount of leakage.

Given the above-background, what are needed in the art are improved systems and methods for reducing leakage in SRAM.

Discussion or citation of a reference herein will not be construed as an admission that such reference is prior art.

3 SUMMARY

Disclosed are approaches that address the drawbacks with known memory leakage techniques. Instead of removing the bias for a single physical row during a read operation, as disclosed in U.S. Pat. No. 7,061,794 B1, the bias voltage is removed from an entire sector of physical rows (e.g., 32 physical rows) that contains the physical row to be read during a given read operation. This allows for the sector decode logic and biasing logic to be placed at the top and/or bottom of the array together with the placement of ground lines vertically that get connected to the corresponding sectors inside the array. It provides significant area overhead savings since the control circuitry is just placed a few times, at most, per memory bank instead of at each physical row of each sector in the memory bank. The disclosed memory architectures have the additional advantage that the extra logic and circuitry for the sector bias scheme does not gate the memory access path. Thus, memory read operations are faster using the disclosed memory leakage techniques and circuitry.

One embodiment provides a sector-based source-biasing scheme for SRAM in order to reduce leakage. In standby mode, sectors of physical rows are deselected and a source-biasing potential is provided to SRAM cells. In read mode, a sector containing a selected physical row is deactivated (the source bias is removed) by deactivating the source-biasing potential provided to the physical rows of the selected sector, whereas the remaining SRAM cells in the remaining sectors in the memory continue to be source-biased. Source-biasing potential may be provided by applying a select voltage to the source terminal of the SRAM cells in the selected sector or by appropriately biasing the body well potential thereof.

The main idea of the source-biasing scheme is to reduce the leakage across the access devices (or, pass gates) of the bit-cells (e.g., the memory cells) of the memory. Since the leakage across the pass gate is due to $V_{DS}$ (=supply voltage), the present disclosure is directed to reducing it by raising the potential of ground node within each bitcell. Thus, in one implementation, the ground nodes (e.g., source terminals of the pull-down devices) of bitcells the physical rows in a sector of a memory bank are connected together and maintained at around 50 to 250 millivolts. This bias voltage can vary based on the cell technology, design rules, operating voltage, chip composition, etc. When a given physical row is selected for a read operation, the ground potential for the physical rows in the sector that include the given physical row is driven to a ground voltage by using a pair of sector decoders and sector bias circuit mechanisms. During this read operation, the bit-cells of other sectors in the memory bank are driven to a bias voltage thereby causing such bitcells to substantially reduce leakage because of the biasing potential that continues to be maintained. Therefore, only the bitcells in the sector containing the physical row being accessed will have leakage across their pass gates; the cells of all other cells in the remaining sectors in the memory bank will have significantly reduced leakage (due to their raised ground nodes) resulting in a read current that is significantly greater than any accumulated leakage.

In one embodiment, a static random access memory (SRAM) is provided. The SRAM comprises a plurality of sectors. Typically, these sectors are arranged into a plurality of memory banks. In one example, the SRAM comprises eight memory banks, with each memory bank comprising two sectors. Each sector in the plurality of sectors comprises a plurality of SRAM cells arranged in a plurality bitline rows and a plurality of bitline columns. Each of these bitline rows is a physical row in the sector and may contain any number of SRAM cells, meaning that they have a common write line. Thus, there may be any number of bitline columns. In one example, there are 32 bitline rows in a sector.

For each respective sector in the plurality of sectors, each SRAM cell in the plurality of SRAM cells of the respective sector includes a pair of cross-coupled inverters that are coupled to form a pair of data nodes. For each respective sector in the plurality of sectors, each SRAM cell in the plurality of SRAM cells of the respective sector includes a pull-down device. For each respective sector in the plurality of sectors, the pull-down devices of the plurality of SRAM cells of the respective sector are coupled together. The plurality of SRAM cells of the respective sector are selectively in (i) a working mode (unbiased) in which data in the plurality of SRAM cells can be accessed and in which the pull-down devices of the SRAM cells in the sector are driven to a first voltage or (ii) a standby mode (biased) in which the pull-down devices of the SRAM cells in the sector are driven by a second voltage.

The SRAM also comprises a sector decoder. The decoder is configured to identify a sector in the plurality of sectors to be selectively activated to the working mode based on a decoded sector address in a range of sector addresses. The decoder provides a sector selective no bias signal based on the decoded sector address The SRAM also comprises a plurality of sector bias circuits. Each respective sector bias circuit in the plurality of sector bias circuits is coupled to (i) the sector decoder and (ii) a sector, in the plurality of sectors, which corresponds to the respective sector bias circuit. Each respective sector bias circuit in the plurality of sector bias circuits is selectively configured to provide the first voltage or the second voltage to the pull-down devices of the SRAM cells in the sector that is coupled to the respective sector bias circuit. The respective sector bias circuit provides the second voltage (bias voltage) to the pull-down devices of the SRAM cells in the sector that is coupled to the respective sector bias circuit when the respective sector bias circuit is not receiving the sector selective no bias signal from the sector decoder. The respective sector bias circuit provides the first voltage (working mode voltage, ground voltage) to the pull-down devices of the SRAM cells in the sector that is coupled to the respective sector bias circuit when the respective sector bias circuit is receiving the sector selective no bias signal from the sector decoder.

Another aspect of the present disclosure provides a memory operation method associated with a SRAM. The SRAM comprises a plurality of sectors, each sector in the plurality of sectors comprising a plurality of SRAM cells arranged in a plurality bitline rows and a plurality of bitline columns. For each respective sector in the plurality of sectors, each SRAM cell in the plurality of SRAM cells of the respective sector includes a pair of cross-coupled inverters that are coupled to form a pair of data nodes. For each respective sector in the plurality of sectors, each SRAM cell in the plurality of SRAM cells of the respective sector includes a pull-down device. The pull-down devices of the plurality of SRAM cells of the respective sector are coupled together.

In the memory operation method, a first sector address in a range of sector addresses for a first memory read operation is decoded thereby obtaining a first decoded sector address. The plurality of SRAM cells of a first sector in the plurality of sectors is selectively activated based on the first decoded sector address by driving pull-down devices of the plurality of SRAM cells of the first sector with a first voltage (working mode voltage, ground voltage). A data value stored at a selected SRAM cell in the first sector is read while continuing to drive pull-down devices of the plurality of SRAM cells of the first sector with the first voltage. A second sector address for a second memory read operation is decoded thereby obtaining a second decoded sector address. The plurality of SRAM cells of a second sector are selectively activated based on the second decoded sector address by driving pull-down devices of the plurality of SRAM cells of the second sector with the first voltage. The pull-down devices of the plurality of SRAM cells in the first sector are driven with a second (biasing) voltage thereby restoring the first sector to a biased state.

4 BRIEF DESCRIPTION OF THE DRAWINGS

A more complete understanding of the present invention may be had by reference to the following detailed description when taken in conjunction with the accompanying drawings wherein:

FIG. 1 depicts a high capacity memory structured with eight banks, each bank having its own control and sector biasing scheme in accordance with the teachings of one embodiment of the present disclosure;

5 DETAILED DESCRIPTION

Figure 2:
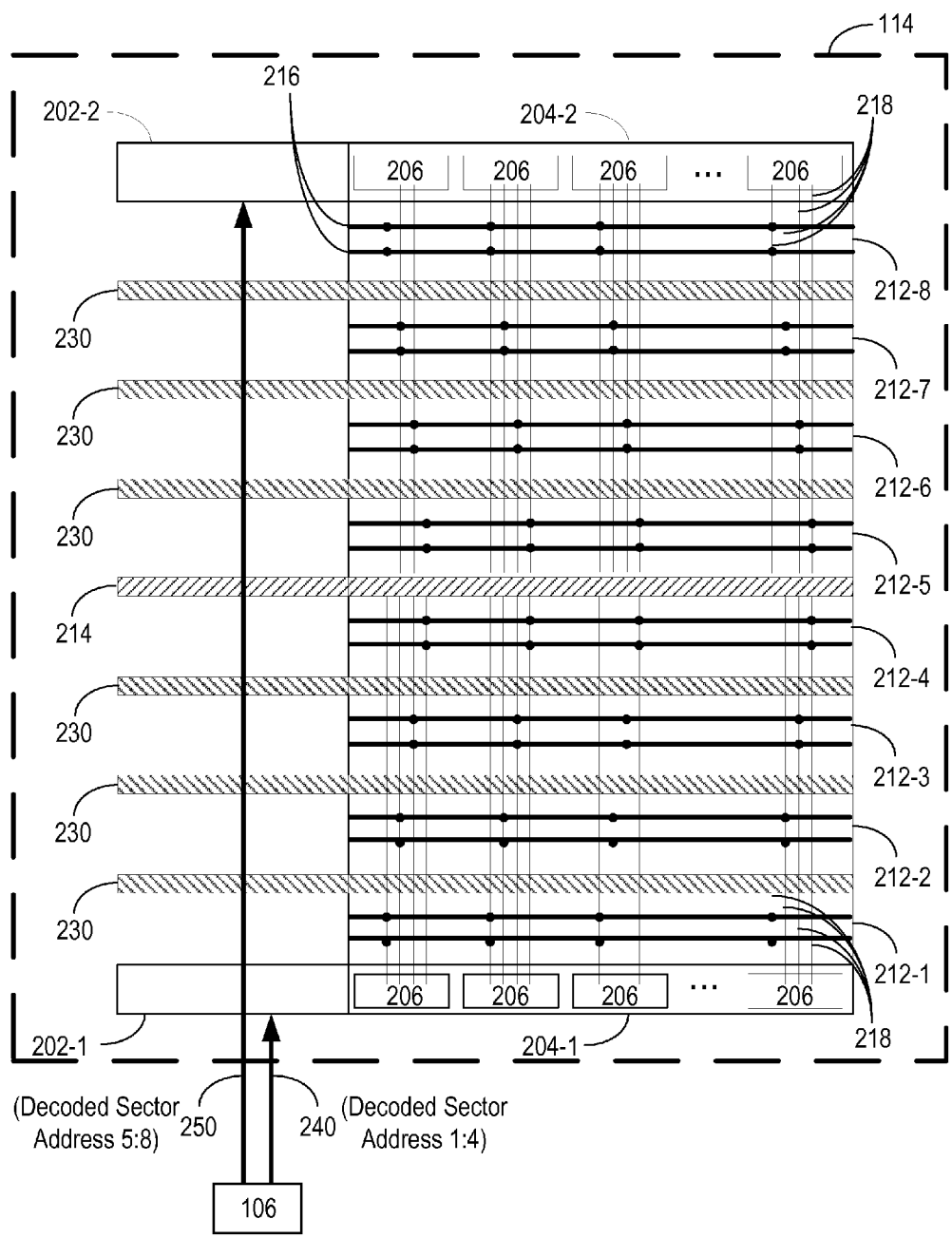
FIG. 2 depicts a detailed sector biasing implementation inside one bank in the high capacity memory of FIG. 1 in accordance with the teachings of one embodiment of the present disclosure.

In the drawings, like or similar elements are designated with identical reference numerals throughout the several views thereof, and the various elements depicted are not necessarily drawn to scale.

FIG. 1 illustrates a top level block diagram of a high capacity memory 100 structured with eight banks 112, each bank 112 having its own control and sector biasing scheme. Although high capacity memory 100 is depicted as having eight banks 112 (112-1 through 112-112-8), in practice, high capacity memory 100 may have any number of banks High capacity memory 100 has global I/O circuitry 102 and global control 104 that is known in the art.

In the embodiment illustrated in FIG. 1, banks 112 in high capacity memory 100 are paired (e.g., bank 112-1 is paired with ban 112-2) with paired banks sharing local I/O 108 and local control 110 circuitry. As further disclosed in FIG. 1, each bank 112 comprises a pair of sectors 114. For example, bank 112-1 comprises sectors 114-1-1 and 114-1-2. Each bank 112 also comprises XDEC circuitry 106.

FIG. 2 provides more detail regarding a memory bank 114 of memory 100 and the XDEC logic 106 that corresponds to the memory bank 114 in accordance with the present disclosure. Bank 114 comprises a plurality of sectors 212. In FIG. 2, bank 114 is depicted as having eight sectors 212. However, in practice, bank 114 can have more or less sectors 212. Each sector 212 in the plurality of sectors of the bank 114 comprises a plurality of SRAM cells (not shown in FIG. 2) arranged in a plurality of bitline rows and a plurality of bitline columns. Each bitline row is referred to as a physical row 216 herein. For the sake of conveying the details of bank 114 with clarity, only two of the physical rows 216 of each given sector 212 are shown in FIG. 2. In practice each sector 212 can have more than two physical rows 216 of bitcells. In fact, in preferred embodiments, each sector 212 comprises 32 or 64 physical rows 216 of bitcells, with each physical row 216 comprising any number of bitcells.

As illustrated in FIG. 2, in an embodiment, the plurality of sectors are divided into a first set of sectors (e.g., sectors 212-1 through 212-4) and a second set of sectors (e.g., sectors 212-5 through 212-8). The first set of sectors is electrically isolated from the second set of sectors by isolator 214. Sectors 212 in the first set of sectors are isolated from each other by array straps 230 as shown in FIG. 2. Sectors 212 in the second set of sectors are also isolated from each other by array straps 230 as also shown in FIG. 2.

In the embodiment depicted in FIG. 2, each of the physical rows 216 in the sectors 212 in the first set of sectors are connected to a select bias control line 218 originating from bias control blocks 206 in a first sector bias control 204-1. Further, each of the physical rows 216 in the sectors 212 in the second set of sectors are connected to a select bias control line 218 originating from bias control blocks 206 in a second sector bias control 204-2.

While logically there is no requirement for a plurality of bias control blocks 206 in a sector bias control 204, in practice, there are a plurality of bias control blocks 206 in order to assert a bias control voltage uniformly across the entire physical row 216 of each of the physical rows 216 in a sector 212.

In some embodiments not shown, the plurality of sectors 212 of bank 114 are not divided into a first set and a second set of sectors and bias control lines 218 from bias circuits 206 of a single sector bias control 204 provide the sector bias signal to the physical rows 216 of all the sectors 212 in the bank 114.

In the embodiment depicted in FIG. 2, XDEC circuitry 106 decodes a sector address into a sector address in a first range of sector addresses (e.g. a decoded sector address in the range of 212-1 through 212-4) or second range of sector addresses (e.g. a decoded sector address in the range of 212-5 through 212-8) for a first memory read operation. If the sector address is in the first range of sector addresses, a control signal is sent through bus 240 to sector decoder 202-1 in order to selectively unbias the bitcells of a specified sector 212 in the first set of sectors. If the sector address is in the second range of sector addresses, a control signal is sent through bus 250 to sector decoder 202-2 in order to selectively unbias the bitcells of a specified sector 212 in the second set of sectors.

Figure 3:
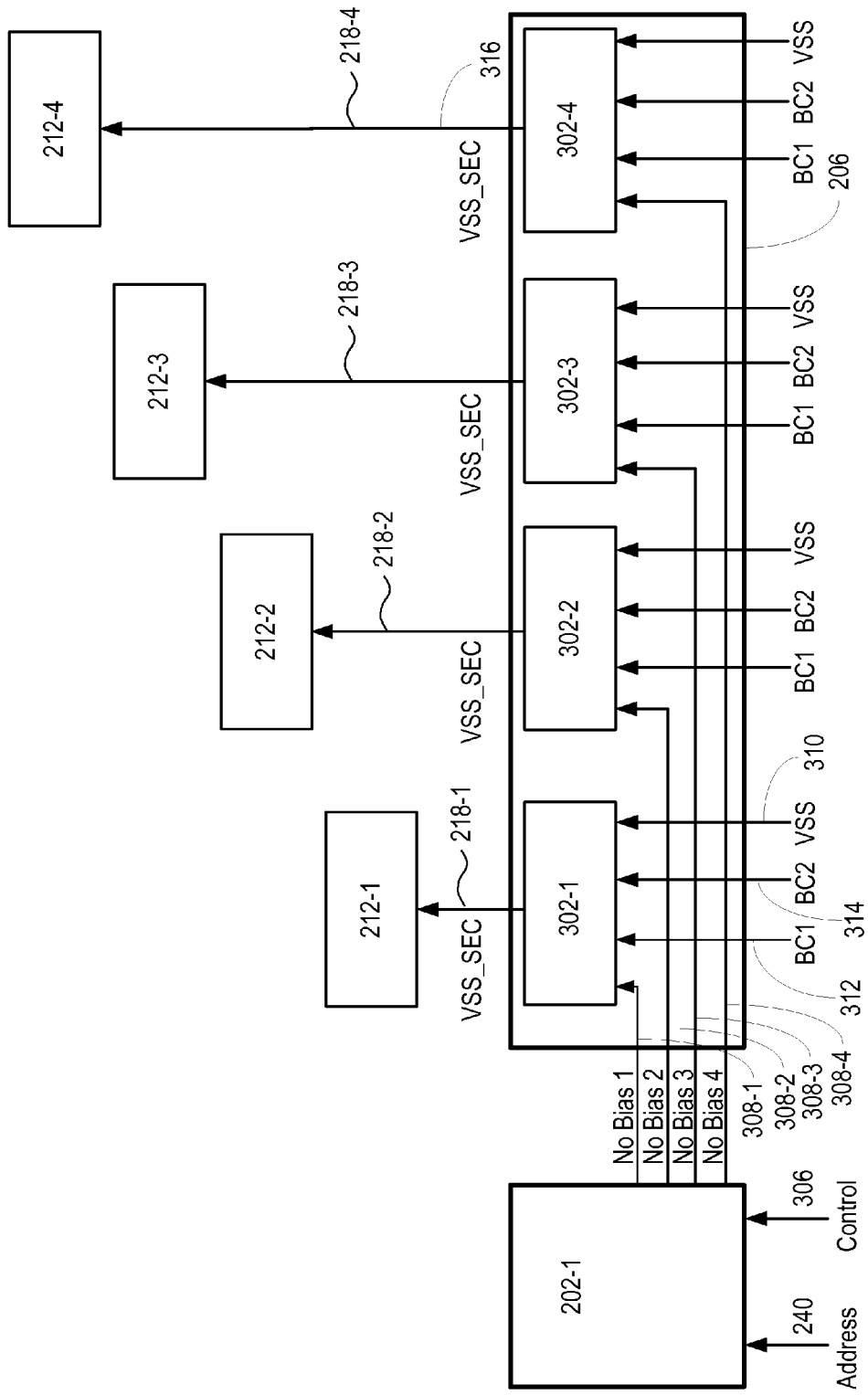
FIG. 3 depicts the top level block diagram of a sector biasing scheme in accordance with the teachings of one embodiment of the present disclosure.

Referring to FIG. 3, details of how the bias voltage of each sector 212 in the first set of sectors is controlled in accordance with an embodiment of the disclosure are provided. Sector decoder 202-1 is respectively coupled to sector bias circuits 302-1 through 302-4 of sector bias block 206 by control lines 308-1 (No_Bias 1) through 308-4 (No_Bias 4). In turn, sector bias circuits 302-1 through 302-4 are respectively coupled to sectors 212-1 through 212-4 by VSS_SEC lines 218-1 through 218-4.

When sector decoder 202-1 is not receiving an address in the first range of sector addresses, sector decoder 202-1 drives 308-1 No_Bias 1 through 308-4 No_Bias 4 to a logical low state. Then, as discussed above in conjunction with FIG. 2, when an address received by sector decoder 202-1 is in a first range of sector addresses, a control signal is sent through bus 240 to sector decoder 202-1 in order to selectively unbias the bitcells of a specified sector 212 in the first set of sectors. Sector decoder 202-1 decodes this address into an identity of a sector 212 in the first range of sector addresses (e.g., as depicted in FIG. 3, sector 212-1, 212-2, 212-3, or 212-4). Consequently, sector decoder 202-1 drives the No_Bias line 308 of the sector bias circuit 302 coupled to the sector 212 specified by the sector address to a high state.

In the embodiment illustrated in FIG. 3, when the No_Bias line 308 between address decoder 202-1 and a sector bias circuit 302 is driven to the high state, the sector bias circuit 302 drives the corresponding VSS_SEC line 218 coupled to the circuit 302 to a ground voltage (first voltage, working voltage) specified by VSS 310. When the No_Bias line 308 between address decoder 202-1 and a sector bias circuit 302 is driven to a low state, the sector bias circuit 302 drives the corresponding VSS_SEC line 218 to a bias voltage (second voltage). In some embodiments, this bias voltage (second voltage) is determined by a function of the combination of a VSS voltage 310, a BC1 control signal 312, and a BC2 control signal 314. Alternatively, in some embodiments, this bias voltage (second voltage) is predetermined and cannot be adjusted.

Figure 4:
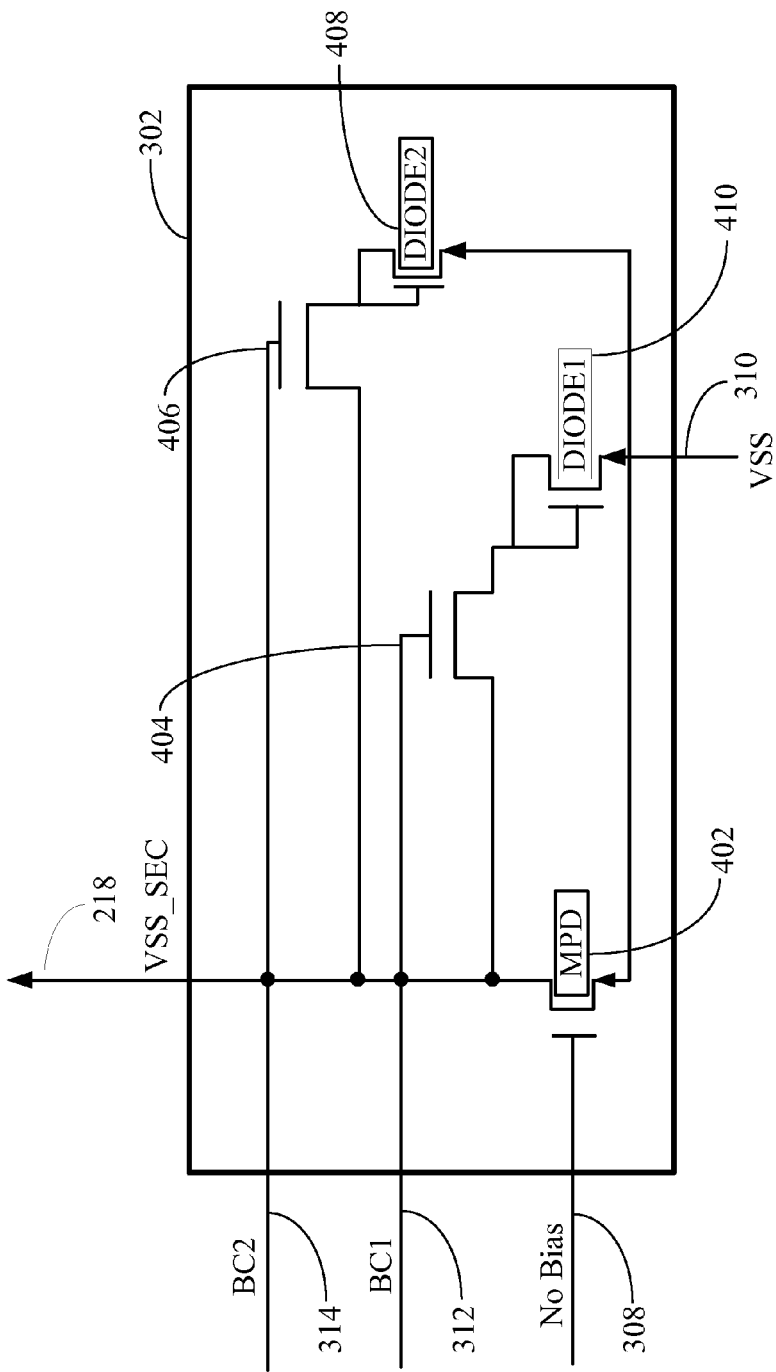
FIG. 4 depicts sector bias circuit for selecting a sector to activate and for determining a bias voltage for a deactivated sector in accordance with the teachings of one embodiment of the present disclosure.

FIG. 4 illustrates a sector bias circuit 302 in accordance with an embodiment of the present invention. When No_Bias 308 is driven high by the address decoder 202-1 (not shown in FIG. 4) coupled to a sector bias circuit 302, field effect transistor (FET) 402 is opened, allowing current to flow through FET 402, and VSS_SEC 218 is driven to ground state VSS 310. When No_Bias 308 is driven low by the address decoder, FET 402 is closed, preventing current from flowing through FET 402, and VSS_SEC 218 is driven to a voltage that is determined by control signals 312 (BC1) and 314 (BC2) as set forth in the following truth table.

TABLE 1

Truth Table

| NO_BIAS 308 | BC1 312 | BC2 314 | Voltage value of VSS_SEC 218 (output from sector bias circuit 302) |
|---|---|---|---|
| 0 | 0 | 0 | VSS_SEC 218 is floating; shut down mode, array content is corrupted |
| 0 | 0 | 1 | VSS_SEC is biased to VSS level 1 (maximum leakage reduction) |
| 0 | 1 | 0 | VSS_SEC is biased to VSS level 2 (moderate leakage reduction) |
| 0 | 1 | 1 | VSS_SEC is Biased to VSS level 3 (least leakage reduction) |

For example, referring to FIG. 4, when No Bias 308 is driven low such that FET 402 is closed, and both BC1 312 and BC2 314 are driven high, the voltage of VSS_SEC 218 is determined by the voltage drop across both FET 410 and FET 408. When No Bias 308 is driven low such that FET 402 is closed, BC1 312 is driven low, and BC2 314 is driven high, the voltage of VSS_SEC 218 is determined by the voltage drop across FET 408. When No Bias 308 is driven low such that FET 402 is closed, BC1 312 is driven high, and BC2 314 is driven low, the voltage of VSS_SEC 218 is determined by the voltage drop across FET 410. The ability to program VSS_SEC to one of three voltage levels (VSS level 1, VSS level 2, VSS level 3) is highly advantageous because it allows for minimization of leakage across different silicon chips (e.g. chips having different dopants and/or other features that affect the optimum value for preventing voltage leakage).

Figure 5:
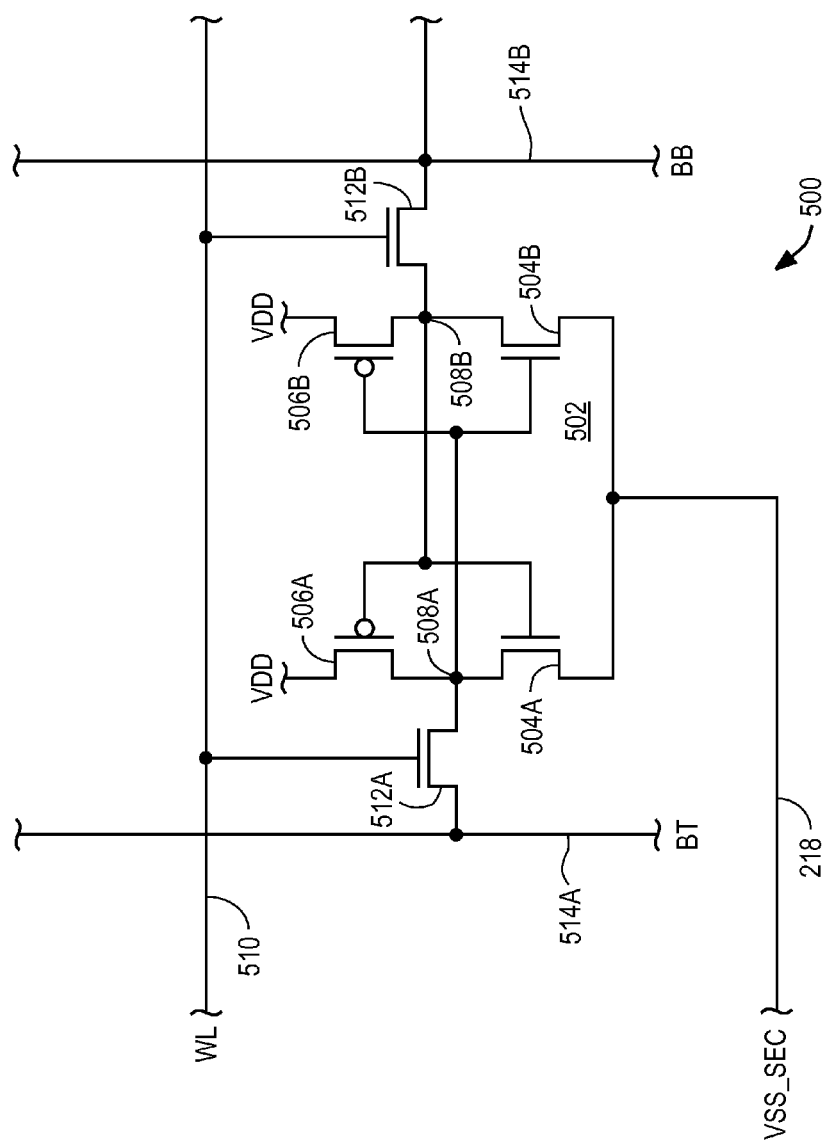
FIG. 5 depicts an exemplary embodiment of a source biased SRAM cell in accordance with the teachings of one embodiment of the present disclosure.

Referring now to FIG. 5, depicted therein is an exemplary embodiment of a source-biased SRAM cell 500 in accordance with the teachings of the present disclosure where leakage is advantageously reduced without disturbing the integrity of stored data. As illustrated, SRAM cell 500 is provided with a pair of complementary bitlines, BT 514A and BB 514B where each of the complementary bitlines may be coupled to appropriate precharge circuitry (not shown in FIG. 5) such that it is pulled to a power supply rail or a reference voltage source (typically $V_{DD}$ or any portion thereof) when the precharge circuitry is activated.

The memory cell 500, also referred to as bitcell, is comprised of a latch 502 that includes a pair of cross-coupled inverters to form a pair of data nodes 508A and 508B. A first P-channel field effect transistor (P-FET) 506A operating as a pull-up device of one of the inverters has its source/drain terminals connected between $V_{DD}$ and a first data node 508A, with the gate thereof connected to a second data node 508B. As is well known, the data nodes 508A and 508B operate as the two complementary storage nodes in the memory cell 500. An N-channel FET (N-FET) 504A operating as a pull-down device has its drain connected to the data node 508A and its source connected to a wordline-based source bias control line (VSS_SEC) 316 that is switchably connected to a bias potential as previously described. The gate of N-FET 504A is coupled to the second data node 508B. With respect to the other inverter, a second P-FET 506B is operable as a pull-up device having its source/drain terminals connected between $V_{DD}$ and the data node 508B, with the gate thereof connected to the data node 508A. A second N-FET 504B is operable as a pull-down device in which the drain is coupled to the data node 508B and the source is commonly connected to the source bias control line 316.

A first N-FET access device 512A is disposed between BT 514A and the data node 508A, with the gate thereof coupled to a wordline (WL) 510. In similar fashion, a second N-FET access device 512B has the source/drain thereof connected between BB 514B and the data node 508B so that its gate is also driven by WL 510. The cross-coupled inverters of the memory cell form latch 502, where nodes 508A and 508B are operable to hold logic levels that correspond to stored data.

Figure 6:
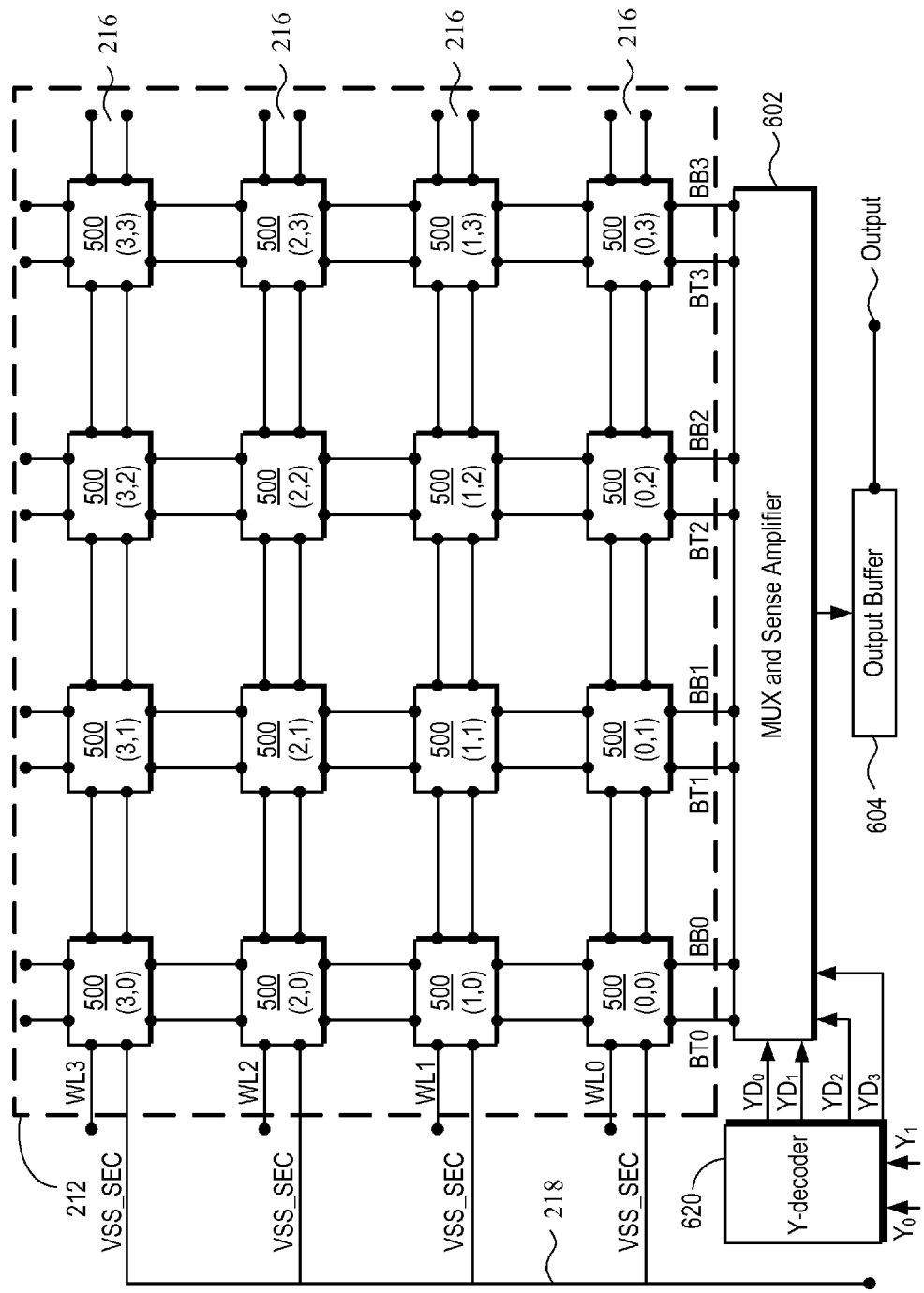
FIG. 6 depicts an exemplary array of source-biased SRAM cells in a sector and circuitry for reading a value of a select SRAM cell from the sector in accordance with the teachings of one embodiment of the present disclosure.

Referring to FIG. 6, a sector 212 in the plurality of sectors of a memory bank 114 is disclosed. The sector 212 comprises a plurality of SRAM cells arranged in a plurality bitline rows 216 and a plurality of bitline columns. As discussed above in conjunction with FIG. 5, each SRAM cell 500 in the plurality of SRAM cells includes a pair of cross-coupled inverters that are coupled to form a pair of data nodes, and each SRAM cell 500 in the plurality of SRAM cells includes a pull-down device. The pull-down devices of the plurality of SRAM cells of the sector 212 are coupled together and to VSS_SEC 218. The plurality of SRAM cells are selectively in (i) a working mode in which data in the plurality of SRAM cells can be accessed and in which the pull-down devices of the SRAM cells are driven by VSS_SEC 218 to a first voltage (ground voltage) or (ii) a standby mode in which the pull-down devices of the SRAM cells in the sector are driven by VSS_SEC 218 to a second voltage (bias voltage).

When a first sector address in a range of sector addresses is decoded for a first memory read operation and the first decoded sector address specifies a physical row 216 in the sector 212 depicted in FIG. 6, the plurality of SRAM cells of FIG. 6 are selectively activated by driving VSS_SEC to a first voltage (ground voltage). This drives the pull-down devices of the plurality of SRAM cells of the sector 212 to the first voltage. This first voltage is typically ground (0 V). A data value stored at a selected SRAM cell 500 in the sector 212 is read while continuing to drive pull-down devices of the plurality of SRAM cells of the sector 212 with the first voltage. The data value stored at a selected SRAM cell is read by (i) selecting a particular bitline row 216 in the sector 212 based on a row address, (ii) driving the WL line for the particular bitline row 216 to a high reading voltage, and (iii) selecting a particular bitline column in the sector 212 based on a column address. The selection of a particular bitline column in the sector based on a column address is performed by reading the columns into MUX and sense amplifier 602 that is controlled by Y-decoder 620 to select the desired column based on a truth table generated associated with control signals $Y_0$ and $Y_1$ (e.g., when $Y_0$ and $Y_1$ are both high, select $YD_0$; when $Y_0$ and $Y_i$ are both low, select $YD_4$; when $Y_0$ is low and $Y_1$ is high, select $YD_2$; and when $Y_0$ is high and $Y_1$ is low, select $YD_3$). The value of the selected SRAM cell 500 is output to output buffer 604 from MUX and sense amplifier 602.

In practice, a physical row 216 typically comprises more than four bitcells 500. In fact, in typically embodiments, a physical row 216 comprises considerably more than four bitcells 500. Conventional MUX blocks are available for receiving the values of four bitcells 500, eight bitcells 500, or sixteen bitcells 500. However, quite typically, there are more bitcells 500 in a physical row 216 than can be read into a single MUX block. Thus, in typical embodiments, a physical row 216 is read into a plurality of MUX blocks. For example, bitcells Y1 through Y4 may be read into a first MUX block, bitcells Y5 through Y8 may be read into a second MUX block, and so forth.

Figure 7:
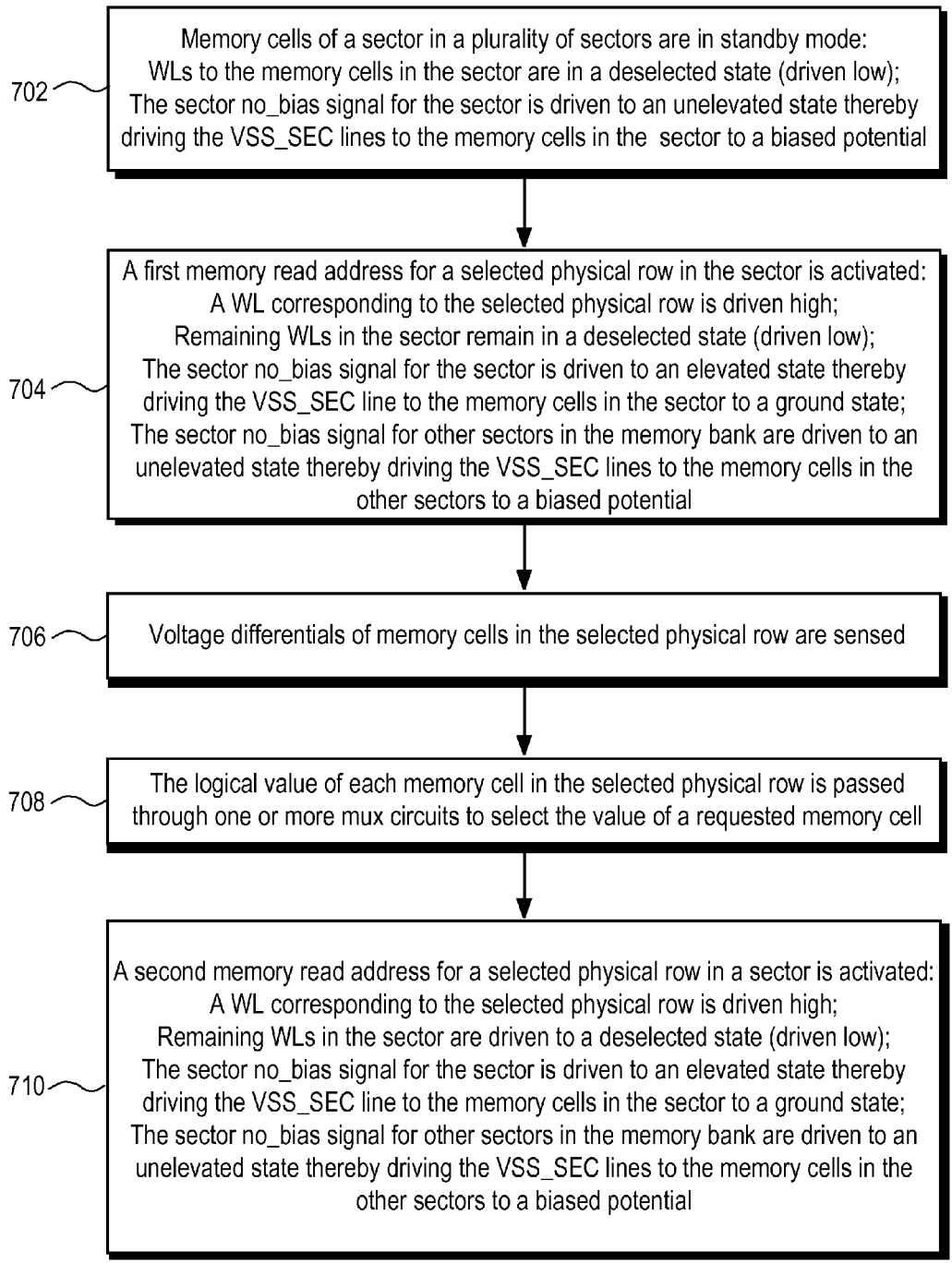
FIG. 7 is a flow chart of memory operations in accordance with the teachings of one embodiment of the present disclosure.

Referring to FIG. 7, disclosed is a memory operation method in accordance with an embodiment of the present disclosure in which, in step 702, memory cells 500 of a sector 212 are in standby mode. In this standby mode, the write lines to the memory cells 500 in the sector 212 are in a deselected state (driven low). Moreover, the sector No_Bias signal 308 for the sector 212 is driven to a low state thereby driving the VSS_SEC lines to the memory cells in the sector to a biased potential (second voltage).

In step 704, a first memory read address for a selected physical row 216 in the sector 212 is activated. A WL corresponding to the selected physical row 216 is driven high. Remaining WLs in the sector 212 remain in a deselected state (driven low). The sector No_Bias 308 signal for the sector 212 is driven to a high state thereby driving the VSS_SEC line to the memory cells 500 in the sector to a ground state (first voltage). The sector No_Bias signal 308 for other sectors 212 in the memory bank 114 are driven to an unelevated state thereby driving the VSS_SEC lines to the memory cells 500 in the other sectors 212 to a biased potential (second voltage).

In step 706, voltage differentials of memory cells 500 in the selected physical row 216 are sensed. In step 708, the logical value of each memory cell 500 in the selected physical row 216 is passed through one or more mux circuits 602 to select the value of a requested memory cell 500.

In step 710, a second memory read address for a selected physical row 216 in a sector 212 is activated. A WL corresponding to the selected physical row 216 is driven high. Remaining WLs in the sector 212 are driven to a deselected state (driven low). The sector No_Bias signal 308 for the sector 212 is driven to an elevated state thereby driving the VSS_SEC line 218 to the memory cells in the sector 212 to a ground state (first voltage). The sector No_Bias signal 308 for other sectors 212 in the memory bank 114 are driven to allow state thereby driving the VSS_SEC lines 218 to the memory cells 500 in the other sectors 212 to a biased potential (second voltage).

Based on the foregoing, it should be appreciated that the present invention provides a simple yet efficient and elegant leakage reduction scheme whereby cell read currents are not compromised as the memory cell technology evolves beyond the current designs of 0.13 microns. Additionally, the wordline-based source biasing mechanism as disclosed herein is adaptable to different SRAM sizes, configurations, and device sizes, wherein source-bias potential levels may be appropriately selected so as not to have deleterious effects (e.g., with respect to the integrity of stored data). Those skilled in the art should also readily recognize upon reference hereto that source-biasing potential may be provided by applying a select voltage to the source terminal of an SRAM cell or by appropriately biasing the body well potential thereof. Furthermore, it should be apparent that the teachings of the present invention may be practiced in standalone SRAM devices as well as compilable SRAM applications having one or more SRAM instances.

6 REFERENCES CITED

All references cited herein are incorporated herein by reference in their entirety and for all purposes to the same extent as if each individual publication or patent or patent application was specifically and individually indicated to be incorporated by reference in its entirety herein for all purposes.

7 MODIFICATIONS

It is believed that the operation and construction of the present invention will be apparent from the foregoing Detailed Description. While some aspects of the method and circuitry shown and described may have been characterized as being preferred, it should be readily understood that various changes and modifications could be made therein without departing from the scope of the present invention as set forth in the following claims.

What is claimed:
1. A static random access memory (SRAM), comprising:
a plurality of sectors, each sector in the plurality of sectors comprising a plurality of SRAM cells arranged in a plurality of bitline rows and a plurality of bitline columns, wherein, for each respective sector in the plurality of sectors,
  each SRAM cell in the plurality of SRAM cells of the respective sector includes a pair of cross-coupled inverters that are coupled to form a pair of data nodes,
  each SRAM cell in the plurality of SRAM cells of the respective sector includes a pull-down device,
  the pull-down devices of the plurality of SRAM cells of the respective sector are coupled together, and
  the plurality of SRAM cells of the respective sector are selectively in (i) a working mode in which data in the plurality of SRAM cells can be accessed and in which the pull-down devices of the SRAM cells in the sector are driven to a first voltage or (ii) a standby mode in which the pull-down devices of the SRAM cells in the sector are driven to a second voltage;
a sector decoder configured to (i) identify a sector in the plurality of sectors to be selectively activated to the working mode based on a decoded sector address in a range of sector addresses and (ii) provide a sector selective no bias signal based on the decoded sector address; and
a plurality of sector bias circuits, wherein each respective sector bias circuit in the plurality of sector bias circuits is:
  (A) coupled to (i) said sector decoder and (ii) a sector, in the plurality of sectors, that corresponds to the respective sector bias circuit, and
  (B) selectively configured to provide the first voltage or the second voltage to the pull-down devices of the SRAM cells in the sector that is coupled to the respective sector bias circuit, wherein the respective sector bias circuit:
    provides the second voltage to the pull-down devices of the plurality of SRAM cells in the sector that is coupled to the respective sector bias circuit when the respective sector bias circuit is not receiving the sector selective no bias signal from the sector decoder, and
    provides the first voltage to the pull-down devices of the plurality of SRAM cells in the sector that is coupled to the respective sector bias circuit when the respective sector bias circuit is receiving the sector selective no bias signal from the sector decoder.

2. The static random access memory according to claim 1, wherein
the plurality of sectors is a first plurality of sectors,
the sector decoder is a first sector decoder,
the plurality of sector bias circuits is a first plurality of sector bias circuits,
the range of sector addresses is a first range of sector addresses, and wherein the static random access memory further comprises:
a second plurality of sectors, each sector in the second plurality of sectors comprising a plurality of SRAM cells arranged in a plurality bitline rows and a plurality of bitline columns, wherein, for each respective sector in the second plurality of sectors,
 each SRAM cell in the plurality of SRAM cells of the respective sector includes a pair of cross-coupled inverters that are coupled to form a pair of data nodes,
 each SRAM cell in the plurality of SRAM cells of the respective sector includes a pull-down device,
 the pull-down devices of the plurality of SRAM cells of the respective sector are coupled together, and
 the plurality of SRAM cells of the respective sector are selectively in (i) a working mode in which data in the plurality of SRAM cells can be accessed and in which the pull-down devices of the SRAM cells in the sector are driven to the first voltage or (ii) a standby mode in which the pull-down devices of the SRAM cells in the respective sector are driven to the second voltage;
a second sector decoder configured to (i) identify a sector in the second plurality of sectors to be selectively activated to the working mode based on a decoded sector address in a second range of sector addresses and (ii) provide a sector selective no bias signal based on the decoded sector address; and
a second plurality of sector bias circuits, wherein each respective sector bias circuit in the second plurality of sector bias circuits is:
 (A) coupled to (i) said second sector decoder and (ii) a sector, in the second plurality of sectors, that corresponds to the respective sector bias circuit,
 (B) selectively configured to provide the first voltage or the second voltage to the pull-down devices of the SRAM cells in the sector that is coupled to the respective sector bias circuit, wherein the respective sector bias circuit
  provides the second voltage to the pull-down devices of the plurality of SRAM cells in the sector that is coupled to the respective sector bias circuit when the respective sector bias circuit is not receiving the sector selective no bias signal from the second sector decoder, and
  provides the first voltage to the pull-down devices of the plurality of SRAM cells in the sector that is coupled to the respective sector bias circuit when the respective sector bias circuit is receiving the sector selective no bias signal from the second sector decoder.

3. The static random access memory according to claim 1, wherein the static random access memory comprises a plurality of memory banks and wherein a memory bank in the plurality of memory banks comprises the plurality of sectors.

4. The static random access memory according to claim 1, wherein the second voltage is programmable.

5. The static random access memory according to claim 1, wherein the second voltage provided by a sector bias circuit in said plurality of sector bias circuits when the respective sector bias circuit is not receiving the sector selective no bias signal from the sector decoder is a function of a combination of:
 (i) a binary logical state of a first control signal,
 (ii) a binary logical state of a second control signal, and
 (iii) a ground voltage received by the sector bias circuit.

6. The static random access memory according to claim 5, wherein the second voltage provided by a sector bias circuit in said plurality of sector bias circuits when the sector bias circuit is not receiving the sector selective no bias signal from the sector decoder is:
 a first value when a state of the first control signal is logical "1" and a state of the second control signal is logical "0",
 a second value when a state of the first control signal is logical "0" and a state of the second control signal is logical "1", and
 a third value when a state of the first control signal is logical "1" and a state of the second control signal is logical "1".

7. The static random access memory according to claim 1, wherein the pull-down device of a SRAM cell in the plurality of SRAM cells of a sector in the plurality of sectors comprises an N-channel field-effect transistor (N-FET) device.

8. The static random access memory according to claim 1, wherein said second voltage is approximately in a range of from about 50 millivolts to about 250 millivolts and said first voltage is less than 50 millivolts.

9. The static random access memory according to claim 1, wherein said second voltage is operable to preserve stability of logic levels stored at said data nodes of an SRAM cell in said plurality of SRAM cells.

10. The static random access memory according to claim 1, wherein said second voltage is applied by biasing a body well potential of said pull-down device.

11. The static random access memory according to claim 1, wherein said second voltage is selected to preserve stability of said plurality of SRAM cells in a sector in said plurality of sectors.

12. The static random access memory according to claim 1, wherein said second voltage is applied by biasing said pull-down devices' respective source terminals.

13. The static random access memory according to claim 1, wherein the sector decoder is configured, based on said decoded sector address in said range of sector addresses, to identify said sector in the plurality of sectors to be selectively activated to the working mode while maintaining the remaining sectors in the plurality of sectors in the standby mode.

14. The static random access memory according to claim 1, wherein
 a respective sector bias circuit in the plurality of sector bias circuits isolates the pull-down devices of the SRAM cells in the sector that is coupled to the respective sector bias circuit from the second voltage when the respective sector bias circuit is providing the first voltage to the pull-down devices of the SRAM cells in the sector that is coupled to the respective sector bias circuit, and
 the respective sector bias circuit isolates the pull-down devices of the SRAM cells in the sector that is coupled to the respective sector bias circuit from the first voltage when the respective sector bias circuit is providing the second voltage to the pull-down devices of the SRAM cells in the sector that is coupled to the respective sector bias circuit.

15. A memory operation method associated with a static random access memory (SRAM), said SRAM comprising a plurality of sectors, each sector in the plurality of sectors comprising a plurality of SRAM cells arranged in a plurality bitline rows and a plurality of bitline columns, wherein, for each respective sector in the plurality of sectors, each SRAM cell in the plurality of SRAM cells of the respective sector includes a pair of cross-coupled inverters that are coupled to form a pair of data nodes, each SRAM cell in the plurality of SRAM cells of the respective sector includes a pull-down device, and the pull-down devices of the plurality of SRAM cells of the respective sector are coupled together, the method comprising:
(A) decoding a first sector address in a range of sector addresses for a first memory read operation thereby obtaining a first decoded sector address;
(B) selectively activating the plurality of SRAM cells of a first sector in the plurality of sectors based on the first decoded sector address by driving pull-down devices of the plurality of SRAM cells of the first sector with a first voltage;
(C) reading a data value stored at a selected SRAM cell in the first sector while continuing to drive pull-down devices of the plurality of SRAM cells of the first sector with the first voltage;
(D) decoding a second sector address for a second memory read operation thereby obtaining a second decoded sector address;
(E) selectively activating the plurality of SRAM cells of a second sector based on the second decoded sector address by driving pull-down devices of the plurality of SRAM cells of the second sector with the first voltage; and
(F) driving pull-down devices of the plurality of SRAM cells in the first sector with a second voltage.

16. The memory operation method of claim 15, wherein the reading (C) comprises (i) selecting a particular bitline column in the first sector based on a column address and (ii) selecting a particular bitline row in the first sector based on a row address thereby identifying said selected SRAM cell.

17. The memory operation method of claim 15, wherein a value of the second voltage is determined by a function of a combination of:
(i) a binary logical state of a first control signal,
(ii) a binary logical state of a second control signal, and
(iii) a ground voltage received by a sector bias circuit coupled to the first sector.

18. The memory operation method of claim 17, wherein a value of the second voltage is:
a first value when a state of the first control signal is logical "1" and a state of the second control signal is logical "0",
a second value when a state of the first control signal is logical "0" and a state of the second control signal is logical "1", and
a third value when a state of the first control signal is logical "1" and a state of the second control signal is logical "1".

19. The memory operation method of claim 15, wherein a value of said second voltage is approximately in a range of from about 50 millivolts to about 250 millivolts.

20. The memory operation method of claim 15, wherein the plurality of sectors is a first plurality of sectors and the range of sector addresses is a first range of sector addresses, said SRAM comprising a second plurality of sectors, each sector in the second plurality of sectors comprising a plurality of SRAM cells arranged in a plurality bitline rows and a plurality of bitline columns, wherein, for each respective sector in the second plurality of sectors, each SRAM cell in the plurality of SRAM cells of the respective sector includes a pair of cross-coupled inverters that are coupled to form a pair of data nodes, each SRAM cell in the plurality of SRAM cells of the respective sector includes a pull-down device, and the pull-down devices of the plurality of SRAM cells of the respective sector are coupled together, the memory operation method further comprising:
when said first sector address is in said first range of sector addresses, performing steps (A) through (F); and
when said first sector address is in a second first range of sector addresses, performing the steps of:
(A2) decoding the first sector address in the second range of sector addresses for a memory read operation thereby obtaining a third decoded sector address;
(B2) selectively activating the plurality of SRAM cells of a third sector in the second plurality of sectors based on the decoded sector address by driving pull-down devices of the plurality of SRAM cells of the third sector with the first voltage;
(C2) reading a data value stored at a selected SRAM cell in the third sector while continuing drive pull-down devices of the plurality of SRAM cells of the third sector with the first voltage; and
(D2) decoding a second sector address for a second memory read operation thereby obtaining a second decoded sector address;
(E2) selectively activating the plurality of SRAM cells of a second sector based on the second decoded sector address by driving pull-down devices of the plurality of SRAM cells of the second sector with the first voltage; and
(F2) driving pull-down devices of the plurality of SRAM cells in the third sector with a second voltage.

21. The memory operation method of claim 15, wherein said second voltage is approximately in a range of from about 50 millivolts to about 250 millivolts and said first voltage is less than 50 millivolts.

* * * * *